United States Patent [19]
Sato et al.

[11] Patent Number: 5,474,844
[45] Date of Patent: Dec. 12, 1995

[54] IMAGE-FORMING TRANSFER MATERIAL INCLUDING A POLYESTER FILM

[75] Inventors: Yoshinori Sato, Yamato; Tetsuya Masuda, Machida, both of Japan

[73] Assignees: Diafoil Hoechst Company, Limited; Mitsubishi Chemical Corporation, both of Tokyo, Japan

[21] Appl. No.: 273,179

[22] Filed: Jul. 26, 1994

[30] Foreign Application Priority Data

Jul. 27, 1993 [JP] Japan ................................. 5-185326

[51] Int. Cl.$^6$ ............................ B32B 7/12; B32B 5/16
[52] U.S. Cl. ..................... 428/332; 428/195; 428/480; 430/11; 430/13; 430/14; 430/15; 528/272
[58] Field of Search ................... 428/480, 332, 428/195; 430/11, 13, 14, 15; 528/272

[56] References Cited

U.S. PATENT DOCUMENTS

| | | | |
|---|---|---|---|
| 4,999,266 | 3/1991 | Platzer et al. | 430/14 |
| 5,019,440 | 5/1991 | Ogasawara et al. | 428/195 |
| 5,130,189 | 7/1992 | Hart | 428/331 |
| 5,141,916 | 8/1992 | Katayama et al. | 503/227 |

Primary Examiner—James J. Seidleck
Assistant Examiner—Terressa Mosley
Attorney, Agent, or Firm—Foley & Lardner

[57] ABSTRACT

A polyester film for an image-forming transfer material, wherein a difference $\Delta\alpha_t$ between the maximum coefficient of thermal expansion and the minimum coefficient of thermal expansion in the film plane is not larger than $1.0 \times 10^{-5}/°C.$, and the maximum coefficient of thermal expansion $\alpha_{tmax}$ is not larger than $2.5 \times 10^{-5}/°C.$, which can form a high quality color image having less deviation and a high image density.

17 Claims, No Drawings

IMAGE-FORMING TRANSFER MATERIAL INCLUDING A POLYESTER FILM

BACKGROUND OF THE INVENTION

1. Field of the Invention

The present invention relates to a polyester film for an image-forming transfer material. In particular, the present invention relates to a polyester film on which a high quality image is formed and from which the image is transferred to a receptor in a printing method which prints a full color image using an image-forming transfer material comprising a polyester film and a coloring light-sensitive layer formed thereon.

2. Description of the Related Art

There is known a printing method in which plural image-forming materials each comprising a polyester film and a coloring light-sensitive layer formed thereon are used, each image of yellow, magenta, cyan and black is formed on the respective image-forming material and then the image is transferred to a receptor to print a full color image on the receptor. Such method is preferably used in a color correction prior to real color printing. In such case, plural image-forming transfer materials are used to make one full color print, and positions of all the images relative to the receptor should be strictly adjusted. Otherwise, color deviation appears, so that the quality of the printed image is greatly deteriorated.

To overcome the above problem, it may be contemplated to precisely adjust the positions of the transfer sheets carrying the developed images of respective colors. However, when accuracy of positioning of the transfer sheets is mechanically improved, the color deviation may not be completely prevented, and in some cases, the color deviation which can be identified by eyes may appear.

Since a dimensional change of the substrate film of the transfer sheet has some influence on the color deviation, it is contemplated to suppress the color deviation by making the degrees of dimensional change of the substrate films same. That is, in the production of a biaxially oriented polyester film, the degree of dimensional change varies with a position in a width direction of the film because of bowing. Then, it is contemplated to use a center part of the film, or the same parts of the right and left edge portions of the film in order to suppress the color deviation. However, the use of the specific part of the film decreases the productivity, or the right and left parts can be confused, whereby the quality of the image is worsened greatly.

SUMMARY OF THE INVENTION

One object of the present invention is to provide a polyester film which is suitable as a substrate film of an image-forming transfer material.

Another object of the present invention is to provide a polyester film which has coefficients of thermal expansion suitable for suppressing color deviation to provide a good quality color image on a receptor.

According to the present invention, there is provided a polyester film for an image-forming transfer material, wherein a difference $\Delta\alpha_t$ between the maximum coefficient of thermal expansion and the minimum coefficient of thermal expansion in the film plane is not larger than $1.0\times10^{-5}$/°C., and the maximum coefficient of thermal expansion $\alpha_{tmax}$ is not larger than $2.5\times10^{-5}$/°C.

DETAILED DESCRIPTION OF THE INVENTION

Herein, the polyester is intended to mean a polyester prepared from an aromatic dicarboxylic acid or its ester and a glycol in which at least 80% of repeating units are ethylene terephthalate units or ethylene-2,6-naphthalate units. Insofar as this range is maintained, the polyester may comprise at least one third component.

Examples of the carboxylic acid other than terephthalic acid and 2,6-naphthalenedicarboxylic acid are isophthalic acid, phthalic acid, adipic acid, sebacic acid, hydroxycarboxylic acids (e.g. p-hydroxyethoxybeonzoic acid, etc.), and the like. Examples of the glycol other than ethylene glycol are diethylene glycol, propylene glycol, butanediol, 1,4-cyclohexanedimethanol, neopentyl glyclol, and the like. They may be used independently or as a mixture thereof.

To improve the handling property of the film, small protrusions may be formed on the surface of the film, whereby a suitable slipperiness is imparted to the film. To this end, small particles are added to the polyester. Examples of the particles are inorganic particles such as calcium carbonate, calcium phosphate, silica, kaolin, talc, titanium dioxide, alumina, barium sulfate, calcium fluoride, lithium fluoride, zeolite, molybdenum sulfate, etc., organic particles such as crosslinked polymer particles, calcium oxalate, etc., and precipitated particles formed in the production of the polyester. The precipitated particles means those precipitated in a reaction system when a polymerization system using an alkali metal or alkaline earth metal compound as a transesterification catalyst is subjected to conventional polymerization. The precipitated particles may be formed by the addition of terephthalic acid in the transesterification reaction or the polycondensation. In such case, at least one phosphorus compound such as phosphoric acid, trimethyl phosphate, triethyl phosphate, tributyl phosphate, acidic ethyl phosphate, phosphorous acid, trimethyl phosphite, triethyl phosphite, tributyl phosphite, and the like may be used. When the polymer is made through esterification, inactive particles can be precipitated by the above method also. For example, before or after the esterification, the alkali metal or alkaline earth metal compound is added, and the polycondensation is effected in the presence or absence of the phosphorus compound.

An average particle size of the particles to be contained in the polyester film of the present invention is preferably from 0.01 to 5.0 μm, more preferably from 0.1 to 3.0 μm. When the average particle size exceeds 5.0 μm, the surface roughness of the film becomes too large so that the clearness of the image may be lost. When the average particle size is less than 0.01 μm, the protrusions are not sufficiently formed, so that the handling property of the film may not be desirably improved.

While a single kind of the particles may be used, it is possible to use two ore more kinds of particles or two or more types of particles having different particle sizes.

A content of the particles is preferably from 0.001 to 10.0% by weight, more preferably from 0.01 to 5.0% by weight, most preferably from 0.05 to 2.0% by weight based on the weight of the polyester. When the content of the particles is less than 0.001% by weight, the handling property of the film may be insufficient. When the content of the particles exceed 10.0% by weight, the surface roughness becomes too large, or the transparency of the film is worsened, so that the clearness of the image may be deteriorated.

To produce the polyester film containing the particles, the particles may be added during the synthesis of the polyester or directly to the prepared polyester. When the particles are added during the synthesis of the polyester, preferably the particles are dispersed in ethylene glycol and so on to form a slurry, and the slurry is added to the reaction system at a suitable stage of the polyester synthesis. When the particles are added directly to the polyester, preferably the particles in the form of dry powder or a slurry in water or an organic solvent having a boiling point of 200° C. or lower is added to the polyester in a twin screw extruder. The particles may be comminuted, dispersed, sieved or filtered before use.

To conveniently adjust the content of the particles in the polyester, a master batch of the polyester containing the particles at a high concentration is prepared and a suitable amount of the master batch is diluted with the polyester composition containing substantially no particle.

To improve the clearness of the image, the surface roughness Ra of the polyester film is not larger than 0.10 μm, preferably not larger than 0.050 μm. To improve the handling property, the surface roughness Ra is at least 0.003 μm, preferably at least 0.005 μm.

When the image is formed by irradiating the coloring light sensitive layer with light, the light can be irradiated through the base film. In such case, preferably the film has high light transmittance. Practically, the light transmittance at a wavelength of 360 nm is at least 50%, in particular, at least 60%.

The polyester film of the present invention may be a single layer film or a multilayer film. In the case of a multilayer film, the outer layers contain the above particles, while the intermediate layer or layers contain substantially no particles or a less percentage of the particles than the outer layers, whereby both the handling property and the transparency of the film are satisfied at high levels. That is, the above light transmittance is made large, while the clearness of the image is improved.

It is advantageous from the view point of a raw material cost to use a cheap raw material to form the intermediate layer(s). As the cheat raw material, recycled materials, or a polyester resin containing substantially no particle can be used.

When a film laminating method is used, a film having different surface roughnesses on the two surfaces is provided, whereby the handling property of the film and the quality of image can be improved at the same time.

The polyester used as the raw material of the film of the present invention may have an intrinsic viscosity of at least 0.50 dl/g, preferably at least 0.55 dl/g. When the intrinsic viscosity is less than 0.50 dl/g, the film tends to be broken in the film production step. The upper limit of the intrinsic viscosity is usually 1.0 dl/g or less in view of the productivity of the polyester. In the case of the laminated film, the layers may have the same or different intrinsic viscosities. When the outer layer has the higher intrinsic viscosity than the intermediate layer, the entire film has good slittability when the film is cut in the film production step or the production step of the image-forming materials.

In the polyester film of the present invention, a difference $\Delta\alpha_t$ between the maximum coefficient of thermal expansion and the minimum coefficient of thermal expansion in the film plane is not larger than $1.0\times10^{-5}/°C.$, and the maximum coefficient of thermal expansion $\alpha_{tmax}$ is not larger than $2.5\times10^{-5}/°C.$ When $\Delta\alpha_t$ exceeds $1.0\times10^{-5}/°C.$ or when $\alpha_{tmax}$ exceeds $2.5\times10^{-5}/°C.$, the full color image formed by the transfer severely suffers from the color shear and the image quality is considerably deteriorated.

The reason for the above phenomena may be as follows:

The image of each color is developed at a temperature around room temperature, while the image is transferred to the receptor at a temperature of 60° C. to 130° C. Then, the dimensional change is caused by the temperature difference between the image forming and the image transfer, which results in the color shear. The dimensional change may vary with the coefficient of thermal expansion $\alpha_t$ of each film. When $\alpha_t$ has anisotropy in the film plane and the anisotropy differs between the films carrying the different color images, the large color shear occurs. When the maximum value of $\alpha_t$ is large, it is difficult to precisely adjust the transfer potions of the films carrying the color images, whereby the color shear is caused.

The difference $\Delta\alpha_t$ is preferably not larger than $5.0\times10^{-6}/°C.$, more preferably not larger than $3.0\times10^{-6}/°C.$ The maximum coefficient of thermal expansion $\alpha_{tmax}$ is preferably not larger than $2.0\times10^{-5}/°C.$, more preferably not larger than $1.5\times10^{-5}/°C.$ The lower limit of $\alpha_{tmax}$ is not critical. In the case of the polyester film, the lower limit is about $1.0\times10^{-6}/°C.$ In the present invention, the coefficient of thermal expansion of the polyester film should satisfy the above requirements. When the polyester film is used as the image-forming transfer material, in particular, when the film size is large, the property distribution in the width direction of the film in the production step will decrease the image quality. Then, the above requirements are preferably satisfied over the entire area of the image-forming transfer material to achieve the high image quality.

To obtain the polyester film having the above qualities, the film has a birefringence $\Delta n$ of not larger than 0.030, and an average refractive index $n_{ave}$ of at least 1.595. The birefringence $\Delta n$ and the average refractive index $n_{ave}$ are defined by the following equations:

$$\Delta n = (n_\gamma - n_\beta)$$

$$n_{ave} = (n_\alpha + n_\beta + n_\gamma)/3$$

wherein $n_\gamma$ is a refractive index in the main orientation direction in the film plane, $n_\beta$ is a refractive index in a direction perpendicular to the main orientation direction in the film plane, and $n_\alpha$ is a refractive index in a thickness direction of the film.

When the birefringence $\Delta n$ exceeds 0.030, the anisotropy of the properties relating to the dimensional thermal stability of the film including the coefficient of thermal expansion tends to increase and may cause the color deviation. When the average refractive index $n_{ave}$ is less than 1.595, $\alpha_{tmax}$ may increase or a shrinkage factor of the film may increase so that the quality of the transferred image may be decreased. The birefringence $\Delta n$ is more preferably not larger than 0.020, in particular not larger than 0.010. The average refractive index $n_{ave}$ is more preferably from 1.600 to 1.610.

In a preferred embodiment, a shrinkage factor of the polyester film is not larger than 1.0% both in the machine and transverse directions at 100° C. When the shrinkage factor is larger than this limit, the film may be shrunk or wrinkled in a step for forming the coloring light sensitive layer on the film, or the image quality may be deteriorated due the dimensional change in the image transfer step.

A thickness of the polyester film of the present invention is usually from 20 to 250 μm, preferably from 30 to 150 μm. When the film thickness is smaller than 20 μm, the film has insufficient strength, film traveling may be troublesome or the film may be wrinkled in the step for forming the coloring light-sensitive layer on the film, the step for exposing and developing the light sensitive layer to form the image and the image transfer step. When the film thickness exceeds 250 µm, the film becomes too stiff, so that its traveling may be difficult, or image density irregularity may appear in the transfer step.

Now, a production method of the polyester film of the present invention will be explained.

A polyester raw material is dried by a conventional method and supplied in an extruder. Then, the polyester is molten at a temperature higher than its melting point and extruded through a slit die in the form of a molten sheet.

The extruded molten sheet from the die is quickly cooled to a temperature lower than the glass transition temperature of the polyester on a rotating cooling drum to obtain an unoriented sheet which is substantially amorphous. To improve the flatness of the film, it is preferred to increase the adhesion between the sheet and the rotating cooling drum. To this end, the present invention preferably uses electrostatic pinning or liquid coating adhesion. In the electrostatic pinning, a linear electrode is stretched over the sheet in a direction perpendicular to a flow direction of the sheet, and a direct current of about 5 to 10 kV is applied to the electrode to charge static electricity on the sheet, whereby the adhesion of the sheet to the drum is increased. In the liquid coating adhesion, the whole or a part (e.g. parts contacting to the both edges of sheet) of the peripheral surface of rotating cooling drum is coated with a liquid uniformly, whereby the adhesion of the drum to the sheet is increased. These two methods may be used in combination in the present invention, if desired.

In the present invention, the obtained film is biaxially drawn. Concretely, the unoriented sheet is drawn in one direction with a roll or a tenter at a temperature of preferably 70° to 150° C., more preferably 80° to 130° C. at a draw ratio of 2.2 to 6, preferably 2.5 to 5 in a single step or multi steps so that the birefringence $\Delta n$ becomes 0.080 or less, preferably 0.065 or less, more preferably 0.050 or less. In the next step, the uniaxially oriented film is drawn in a direction perpendicular to the direction of the first orientation at a temperature of preferably 80° to 150° C., more preferably 90° to 120° C. at a draw ratio of 2.5 to 5, preferably 3.0 to 4.5 to obtain a biaxially oriented film.

It is possible to biaxially orient the sheet at the same time at an area draw ratio of 10 to 40.

Preferably, the obtained biaxially oriented film is heat treated at a temperature of 180° to 240° C. Preferably, the film is shrunk by 2 to 15% in the heat treatment. Alternatively, after the heat treatment, the film is relaxed in a cooling zone in the machine direction or the transverse direction, or in both directions.

To improve the adhesion of the film to a functional layer such as the coloring light-sensitive layer to be formed on the film, a coating layer may be formed on the film surface. The coating layer may be formed during or after the film production. In view of the uniformity of a thickness of the coating layer and productivity, preferably, the coating layer is applied to the film after the first orientation and before the second orientation.

Examples of materials to be coated are polyester, polyamide, polystyrene, polyacrylate, polycarbonate, polyarylate, polyvinyl chloride, polyvinylidene chloride, polyvinyl butyral, polyvinyl alcohol, polyurethane, a copolymer of two or more monomers which constitute these polymers, a blend of two or more polymers, etc. Among them, the polyester resin is most preferred.

Preferably, the coating material is one with which water can be used as a medium. When water is used as the medium, the coating material may be forced to disperse in water using a surfactant. A preferred coating material is a self-dispersing coating material such as a hydrophilic non-ionic material such as a polyether or a material having a cationic group such as a quaternary ammonium salt. A more preferred coating material is a water-soluble or water-dispersible resin having an anionic group.

The polyester film of the present invention may contain 10% by weight or less of other polymer based on the weight of the polyester. Examples of the other polymer are polyethylene, polystyrene, polycarbonate, polysulfone, polyphenylenesulfide, polyamide, polyimide, and the like.

If necessary, the polyester film of the present invention may contain a suitable additive such as an antioxidant, a heat stabilizer, a lubricant, an antistatic agent, a dye, a pigment, and the like.

PREFERRED EMBODIMENTS OF THE INVENTION

The present invention will be illustrated by following Examples, which do not limit the scope of the present invention in any way. In Examples, "parts" are by weight unless otherwise indicated.

in Examples, the properties and characteristics are measured or evaluated as follows:

(1) Average particle size

A centrifugal sedimentation type particle size distribution analyzer (SA-CP3 manufactured by Shimadzu Corporation) is used, and a particle size corresponding to a volume percentage of 50 % in terms of a diameter of an equivalent sphere is regarded as an average particle size.

(2) Intrinsic viscosity $[\eta]$ of polyester

One gram of a polymer is dissolved in 100 ml of a mixed solvent of phenol and tetrachloroethane in a weight ratio of 50:50, and an intrinsic viscosity is measured at 30° C.

(3) Coefficient of thermal expansion $\alpha_t$

Using the TMA (manufactured by Shinku Riko Co., Ltd.), a tension of 200 g/mm$^2$ is applied to a sample film having a width of 5 mm and a length (in a measuring direction) of 25 mm, and temperature is raised at a rate of 5° C./min to draw a temperature-elongation diagram. Two points at 30° C. and 50° C. are connected by a straight line, and a slope of the line is calculated.

A coefficient of thermal expansion is measured at every 10° over 180°. With any sample film, the directions in which the minimum and maximum coefficients of thermal expansion are obtained correspond to the main orientation direction ($\gamma$ direction) in the film plane and the direction ($\beta$ direction) perpendicular to the $\gamma$ direction, respectively.

(4) Birefringence $\Delta n$ and average refractive index $n_{ave}$

Using an Abbe refractometer (manufactured by Atago Optical Co., Ltd.), a refractive index $n_\alpha$ in the thickness direction of the film, a refractive index $n_\gamma$ in the main orientation direction in the film plane, and a refractive index $n_\beta$ in the direction perpendicular to the main orientation direction in the film plane were measured, and a birefringence $\Delta n$ and average refractive index $n_{ave}$ were calculated according to the above described equations.

(5) Center line average surface roughness of film Ra

A center line average surface roughness of a film was measured using a surface roughness meter (SE-3F manufactured by Kosaka Kenkyusho, Ltd.) as follows:

From a surface roughness curve of the film, a portion of a reference length L (2.5 mm) was sampled in the direction of the center line. Assuming the center line of the sampled portion and the direction vertical to the center line as x and y axes, respectively, the roughness curve was expressed as y=f(x). The value obtained from the following formula was represented as Ra (μm):

$$Ra=(1/L)\int_0^L |f(x)|dx.$$

From the surface of the sample film, 10 surface roughness curves were obtained and the average value of Ra for these curves was expressed as the center line average roughness. The measuring conditions include a tip radius of a probe of 2 μm, a probe contact pressure of 30 mg and a cut-off value of 0.08 mm.

(6) Practical characteristics of film as image-forming transfer sheet

Positive Type Light-Sensitive Layer

On one surface of each of four sample films as supports, each of light-sensitive solutions having the following compositions was coated with a bar coater, and dried to form a positive type colored image-forming material with a dry film thickness of 1.5 μm.

| Component | part(s) by weight |
|---|---|
| 2,3,4-Trihydroxybenzophenone-naphtho-quinone-1,2-diazide-4-sulfonate | 0.616 |
| Vinyl acetate-vinyl versatate copolymer (80:20 by weight, weight average molecular weight: 50,000, 50% methanol solution) | 8.768 |
| Pigment shown below | — |
| Cyclohexanone | 35.2 |
| Fluorine type surfactant FC-430 (trade name, produced by 3M, USA) | 0.01 |

| Pigment | |
|---|---|
| Black: Carbon Black MA-100 (trade name, produced by Mitsubishi Kasei Corp.) | 0.99 |
| Cyan: Cyanine Blue 4920 (trade name, produced by Dainichi Seika) | 0.55 |
| Magenta: Seika Fast Carmine 1483 (trade name, produced by Dainichi Seika) | 0.68 |
| Yellow: Seika Fast Yellow 2400 (trade name, produced by Dainichi Seika) | 0.68 |

Formation of Transferred Image

On each of the polyester film surfaces of the positive type colored image-forming materials of four colors prepared in the above step, a color separation screen positive film of the respective color was superposed. Then, the materials were subjected to image exposure for 20 seconds from a distance of 50 cm by a 4 KW metal halide lamp, and then developed by dipping them in a following developing solution at 30° C. for 30 seconds to prepare colored images of four colors:

| Developing solution | |
|---|---|
| Konica PS printing developing solution SDP-1 (trade name, produced by Konica Corp.) | 20 ml |
| Pelex NBL (trade name, produced by Kao Atlas Co.) | 50 ml |
| Water | 400 ml |

The size of the image printed was A1 size (594×841 mm). A sheet to which the image was transferred had pin holes of register pin bars outside of this image in longer side directions and had register marks at four corners of the image and central positions of the respective sides of the image (outside of the image) for the purpose of confirming the size of positional displacement. The sheet had the size of 650×900 mm, which was larger than the image size. Using this sheet, a transferred image of four colors was formed on art paper according to the method described in Example of U.S. Pat. No. 5,068,689, the disclosure of which is hereby incorporated by reference. Drum and press roll temperatures were 80° C., and roll pressure was 4 kg/cm².

Then, the following two qualities were evaluated and ranked according to the following ranks:

(a) Color deviation
  Rank 4: No color deviation was found and a very sharp image was obtained.
  Rank 3 A slight color deviation was found, but a printed image was practically acceptable.
  Rank 2: In some parts of a printed image, color deviation was apparent.
  Rank 3: Over the whole printed image, color deviation was found, and the quality of the image was very poor.

(b) Image density
  Rank 4: A suitable image density was obtained, and no density irregularity was found.
  Rank 3: A slight density irregularity was found but the image was practically acceptable.
  Rank 2: In some parts of the image, the density irregularity was apparent.
  Rank 1: The density of the whole image was low or the density irregularity was apparent over the whole image, and the quality of the image was poor.

EXAMPLE 1

In a reactor, dimethyl terephthalate (100 parts), ethylene glycol (60 parts) and magnesium acetate tetrahydrate (0.09 part) were charged and heated to effect transesterification while removing methanol. The temperature was raised to 230° C. in 4 hours from the start of the reaction, and then the transesterification was terminated.

To the reaction mixture, a slurry of silica particles having an average particle size of 1.5 μm (0.3 part) in ethylene glycol was added.

After the addition of the slurry, phosphoric acid (0.03 part) and antimony trioxide (0.04 part) were added. Thereafter, the pressure of the reaction system was gradually decreased to 40 Pa. and the temperature was raised 280° C. to effect the polycondensation for 4 hours, and a polyester (1) having an intrinsic viscosity of 0.62 dl/g was obtained.

Separately, in the same manner as above except that no silica particle was added, the transesterification and the polycondensation were effected to obtain a polyester (2) containing substantially no particle and having an intrinsic viscosity of 0.65.

The polyester (1) and the polyester (2) were blended in a weight ratio of 25:75, dried by a conventional method and melt extruded by an extruder to obtain an amorphous sheet.

The amorphous sheet was preheated to a temperature of 70° to 100° C., drawn in a machine direction at 90° C. at a draw ratio of 2.3 and further drawn at 90° C. at a draw ratio of 1.2. Then, the uniaxially oriented film was introduced in a tenter and drawn in a transverse direction at 110° C. at a draw ratio of 3.8, followed by heat treating at 235° C. Thereafter, the film was relaxed in the transverse direction at 230° C. by 5%, and also slightly relaxed in the machine direction by adjusting a pulling speed to obtain a biaxially oriented film having a thickness of 75 μm.

EXAMPLE 2

By a co-extrusion method using two extruders, a laminated sheet consisting of two outer layers and one inner layer was produced by forming the both outer layers from a blend of the polyester (1) and the polyester (2) in a weight ratio of 40:60, and forming the inner layer from a blend of a reclaimed polyester (3) which was obtained from edge parts of the films for other uses and so on and the polyester (2) in a weight ratio of 40:50.

The reclaimed polyester (3) contained 0.05% by weight of silica particles having an average particle size of 2.6 μm and had an intrinsic viscosity of 0.58.

The obtained sheet was drawn in the machine direction at 85° C. at a draw ratio of 3.7 and in the transverse direction at 110° C. at a draw ratio of 3.6, followed by heat treatment at 220° C. to obtain a biaxially oriented film having a total thickness of 80 μm and each outer layer thickness of 2 μm.

EXAMPLE 3

In the same manner as in Example 1, a polyester (4) containing 0.3% by weight of silica particles having an average particle size of 2.5 μm and an intrinsic viscosity of 0.67 was prepared.

The polyester (4) and the polyester (2) were blended in a weight ratio of 15:85, and an amorphous sheet was produced in the same manner as in Example 1.

The amorphous sheet was drawn in the machine direction at 90° C. at a draw ratio of 3.6 and in the transverse direction at 130° C. for 4.0, followed by heat treatment at 215° C. Then, the film was relaxed in the transverse direction at 200° C. by 4.5%, and also slightly relaxed in the machine direction by adjusting a pulling speed to obtain a biaxially oriented film having a thickness of 75 μm.

Comparative Example 1

In the same manner as in Example 2 except that the draw ratios were changed to 3.4 in the machine direction and 4.0 in the transverse direction, a biaxially oriented film having a thickness of 80 μm was produced.

Comparative Example 2

In the same manner as in Example 2 except that the temperature in the heat treatment was changed from 220° C. to 190° C., a biaxially oriented film having a thickness of 80 μm was produced.

The physical properties and the results of the evaluation of image qualities are summarized in Tables 1 and 2, respectively.

TABLE 1

| Example No. | Coefficient of thermal expansion (mm/mm/°C.) | | Birefringence $\Delta n$ | Ave. refractive index $n_{ave}$ |
| --- | --- | --- | --- | --- |
| | $\alpha_{tmax}$ | $\Delta\alpha_t$ | | |
| 1 | $1.3 \times 10^{-5}$ | $0.1 \times 10^{-5}$ | 0.005 | 1.6052 |
| 2 | $1.5 \times 10^{-5}$ | $0.2 \times 10^{-5}$ | 0.005 | 1.6040 |
| 3 | $1.8 \times 10^{-5}$ | $0.5 \times 10^{-5}$ | 0.015 | 1.6025 |
| C. 1 | $2.3 \times 10^{-5}$ | $1.3 \times 10^{-5}$ | 0.035 | 1.6042 |
| C. 2 | $2.8 \times 10^{-5}$ | $0.5 \times 10^{-5}$ | 0.010 | 1.5993 |

TABLE 2

| Example No. | Surface roughness of film Ra (μm) | Practical characteristics of transfer material | |
| --- | --- | --- | --- |
| | | Color deviation | Image density |
| 1 | 0.020 | 4 | 4 |
| 2 | 0.018 | 4 | 4 |
| 3 | 0.022 | 3 | 3 |
| C. 1 | 0.019 | 1 | 3 |
| C. 2 | 0.018 | 2 | 2 |

What is claimed is:

1. An image-forming transfer material comprising a polyester film, wherein a difference $\Delta\alpha_t$ between the maximum coefficient of thermal expansion and the minimum coefficient of thermal expansion in the film plane is not larger than $1.0\times10^{-5}$/°C., and the maximum coefficient of thermal expansion $\alpha_{tmax}$ is not larger than $2.5\times10^{-5}$/°C., wherein said polyester is prepared from an aromatic dicarboxylic acid or its ester and a glycol selected from the group consisting of ethylene glycol, diethylene glycol, propylene glycol, butanediol, 1,4-cyclohexanedimethanol and neopentyl glycol, and wherein said polyester film has a birefringence of not larger than 0.030 and an average refractive index of at least 1.595.

2. The image-forming transfer material according to claim 1, wherein said polyester film contains particles having an average particle size of 0.01 to 5.0 μm, wherein a content of said particles is from 0.001 to 10.0% by weight based on the weight of the polyester.

3. The image-forming transfer material according to claim 1, wherein said polyester film has a surface roughness Ra of not larger than 0.10 μm.

4. The image-forming transfer material according to claim 4, wherein said surface roughness Ra is at least 0.003 μm.

5. The image-forming transfer material according to claim 1, wherein said polyester film has a light transmittance of at least 50% at a wavelength of 360 nm.

6. The image-forming transfer material according to claim 1, wherein said polyester has an intrinsic viscosity of at least 0.50 dl/g, measured at 30° C. in 100 ml of a mixed solvent of phenol and tetrachloroethane in a weight ration of 50:50.

7. The image-forming transfer material as claimed in claim 1, wherein the thickness of said polyester film is from 20 to 250 μm.

8. The image-forming transfer material as claimed in claim 1, wherein said polyester film has a birefringence of not larger than 0.020 and an average refractive index of from 1.600 to 1.610.

9. The image-forming transfer material as claimed in claim 1, wherein the difference $\Delta\alpha_t$ between the maximum coefficient of thermal expansion and the minimum coefficient of thermal expansion in the film plane is not larger than $5.0\times10^{-6}$/°C.

10. The image-forming transfer material as claimed in claim 9, wherein the difference $\Delta\alpha_t$ between the maximum coefficient of thermal expansion and the minimum coefficient of thermal expansion in the film plane is not larger than $3.0\times10^{-6}$/°C.

11. The image-forming transfer material as claimed in claim 1, wherein the maximum coefficient of thermal expansion $\alpha_{tmax}$ is not larger than $2.0\times10^{-5}$/°C.

12. The image-forming transfer material as claimed in claim 11, wherein the maximum coefficient of thermal expansion $\alpha_{tmax}$ is not larger than $1.5\times10^{-5}$/°C.

13. The image-forming transfer material as claimed in claim 1, wherein said polyester film is a biaxially orientated film prepared by a process comprising (i) drawing extruded polyester in a first direction at a draw ratio of 2.2 to 6, and then (ii) drawing the extruded polyester in a direction perpendicular to the first direction at a draw ratio of 2.5 to 5.

14. The image-forming transfer material as claimed in claim 13, wherein the temperature of drawing in the first direction is from 70° to 150° C., and the temperature of drawing in the direction perpendicular to the first direction is from 80° to 150° C.

15. The image-forming transfer material as claimed in claim 13, wherein said polyester film is prepared by biaxially drawing extruded polyester in a first direction at a draw ratio of 2.5 to 5, and then in a direction perpendicular to the first direction at a draw ratio of 3.0 to 4.5.

16. The image-forming transfer material as claimed in claim 15, wherein the temperature of drawing in the first direction is from 80° to 130° C., and the temperature of drawing in the direction perpendicular to the first direction is from 90° to 120° C.

17. The image-forming transfer material as claimed in claim 13, wherein said polyester film is biaxially oriented by simultaneously drawing extruded polyester in a first direction and at a second direction perpendicular to said first direction at an area draw ratio of 10to40.

* * * * *